United States Patent [19]

Andrews

[11] Patent Number: 4,824,747

[45] Date of Patent: Apr. 25, 1989

[54] METHOD OF FORMING A VARIABLE WIDTH CHANNEL

[75] Inventor: James T. Andrews, Hopewell Township, Mercer County, N.J.

[73] Assignee: General Electric Company, Schenectady, N.Y.

[21] Appl. No.: 789,749

[22] Filed: Oct. 21, 1985

[51] Int. Cl.[4] ............................................. G03H 1/18
[52] U.S. Cl. ...................................... 430/1; 430/323; 430/330; 372/48
[58] Field of Search ............... 430/323, 327, 328, 330, 430/1; 372/48, 96

[56] References Cited

U.S. PATENT DOCUMENTS

| | | | |
|---|---|---|---|
| 2,854,336 | 9/1958 | Gutknecht | 430/323 |
| 3,669,673 | 6/1972 | Chung Sen Ih et al. | 430/1 |
| 4,022,932 | 5/1977 | Feng | 427/93 |
| 4,023,993 | 5/1977 | Scifres et al. | 148/172 |
| 4,099,999 | 7/1978 | Burnham et al. | 148/187 |
| 4,251,780 | 2/1981 | Scifres et al. | 331/94.5 |
| 4,302,729 | 11/1981 | Burnham et al. | 331/94.5 |
| 4,359,776 | 11/1982 | Acket et al. | 372/46 |
| 4,369,513 | 1/1983 | Umeda et al. | 372/46 |

FOREIGN PATENT DOCUMENTS

| | | |
|---|---|---|
| 57-75431 | 5/1982 | Japan ................................. 430/330 |
| 58-97888 | 6/1983 | Japan . |
| 58-219738 | 12/1983 | Japan . |
| 58-220486 | 12/1983 | Japan . |
| 59-127892 | 7/1984 | Japan . |

OTHER PUBLICATIONS

Abita, Joseph L., "Improved Conventional Photolithography by Relief Mask Processing," *Solid State Technology*, pp. 48–49, Jun. 1974.

*Primary Examiner*—José G. Dees
*Attorney, Agent, or Firm*—William Squire; James C. Davis, Jr.; Paul R. Webb, II

[57] ABSTRACT

A method of forming a channel of varying width in a body comprises the steps of forming a plurality of masking elements having an opening therethrough intersecting a plurality of the elements on a surface of the body, partially flowing the elements into the opening to form a masking pattern having a variable width opening therethrough, and removing portions of the exposed body to form the channel with a sidewall having a surface contour corresponding to an edge of the masking pattern.

6 Claims, 2 Drawing Sheets

METHOD OF FORMING A VARIABLE WIDTH CHANNEL

The invention described herein was made in the performance of work under NASA Contract No. NAS 1-17351 and is subject to the provisions of Section 305 of the National Aeronautics and Space Act of 1958 (72 Stat. 435; 42 U.S.C. 2457).

The invention relates to a method of producing a variable width channel in a semiconductor body.

BACKGROUND OF THE INVENTION

Periodic corrugations are often useful in semiconductor devices. In particular, distributed feedback (DFB) lasers incorporate a periodic grating in the laser structure which provides spatial variations in the refractive index. When a DFB laser is electrically excited constructive interference of diffracted light gives rise to a stable single wavelength output. In semiconductor devices it is also often useful to form a channel to define an optical waveguide. J. T. Andrews et al. in U.S. patent application No. 80,171 (RCA) entitled "DISTRIBUTED FEEDBACK LASER", filed concurrently herewith, disclose a DFB laser comprising a semiconductor body having opposed end faces and having a channel which varies in width. The variation in channel width is periodic along the length of the channel. As the desired length of each period is often less than one micrometer ($\mu$m) conventional photolithographic techniques to define the channel are generally unavailable.

Well-known holographic techniques have been used to form gratings with a period less than 1 $\mu$m in length. The gratings formed generally comprise a plurality of parallel periodic elements. As these gratings are formed on a planar surface of a structure they have been considered inapplicable in producing a channel in the structure which periodically varies in width. Thus, it would be desirable to have a method for producing a variable width channel.

SUMMARY OF THE INVENTION

A variable width channel in a body may be produced by forming a plurality of masking elements having an opening which intersects a plurality of the elements on a surface of the body. The elements are then caused to partially flow into the opening to form a masking pattern with a variable width opening therethrough. Portions of the body exposed in the variable width opening are then removed to form a channel having a sidewall with a surface contour corresponding to an edge of the masking pattern.

DETAILED DESCRIPTION OF THE PREFERRED EMBODIMENTS

Figure 1:
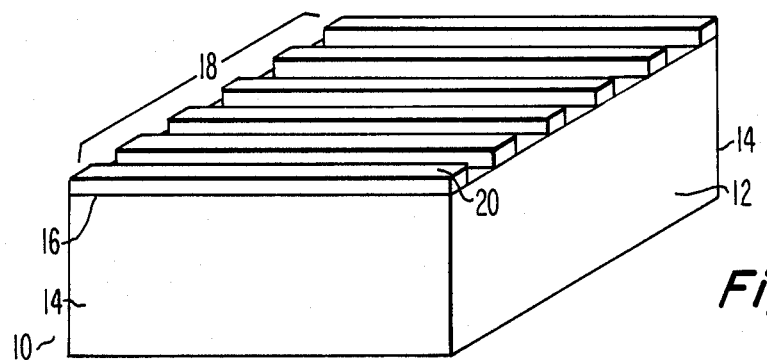
FIGS. 1-4 are perspective views of different steps in the process of forming a variable width channel.

In FIG. 1 a structure 10 comprises a body 12 having a pair of end faces 14 and a major surface 16 extending therebetween. A grating pattern 18 overlies the major surface 16. Typically the grating pattern 18 will comprise a plurality of substantially parallel, linear masking elements 20 extending in the lateral direction, a direction in the plane of both the major surface and the end faces. The grating pattern 18 is typically a photoresist which may be either positive or negative working and must have the characteristic that after exposure it will flow when subjected to a specific environment, typically heat. Suitable resists include, for example, novolac/diazoquinone sensitizer preparations such as AZ 1450B of the Shipley Company. The photoresist may be applied by any conventional procedure, preferably by spin-coating to a thickness typically about 0.1 $\mu$m.

Figure 2:
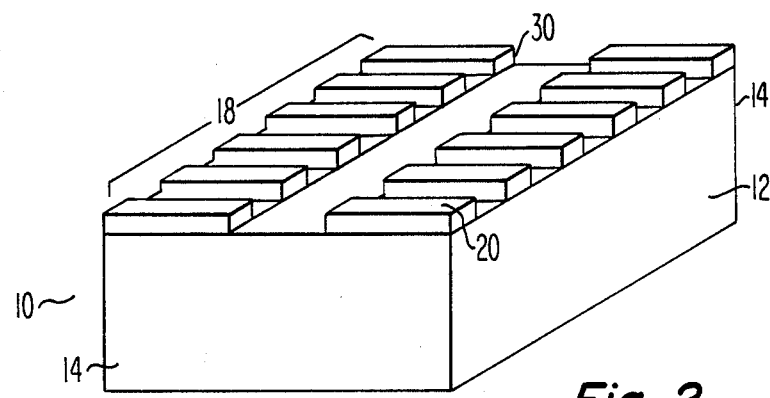
Figure 3:
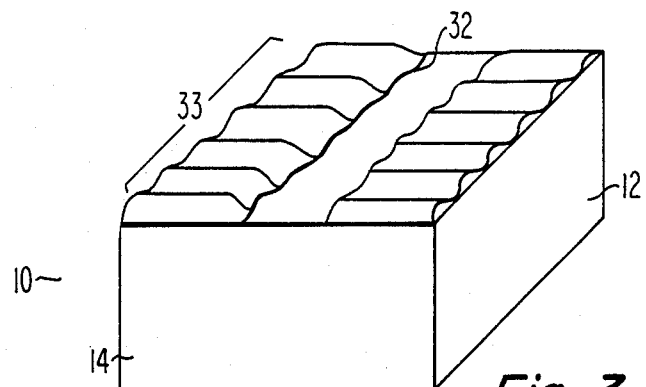

As shown in FIG. 2, an opening 30 is formed which intersects a plurality of masking elements 20 and typically is substantially perpendicular to the end faces 14. The opening 30 is preferably linear and is formed in the grating pattern 18 by masking, exposing, and developing the photoresist. Alternatively, if a negative resist is used, the opening 30 may be formed by masking the structure 10 when the masking elements 20 are formed. The structure 10 is then exposed to an environment, typically heat, which causes the elements 20 to flow such that the elements 20 reduce in amplitude relative to the major surface 16 and partially extend into the opening 30 to form a variable width opening 32 bordered by a periodically varying masking pattern 33, as depicted in FIG. 3. Preferably, the elements 20 on each side of the opening 30 substantially flow together such that the spacing between the elements 20 is eliminated. Baking times and temperatures to create the proper flow of photoresist are typically determined experimentally. If an AZ 1450B photoresist is used, typically the device will be baked for 10 minutes at about 120° C.

Figure 4:
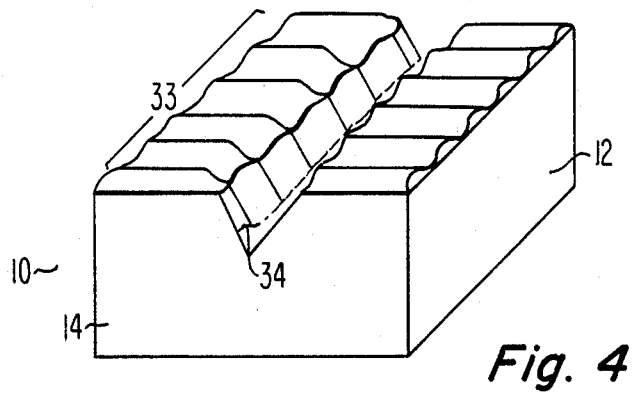

Portions of the body 12, exposed in the variable width opening 32, are then removed to form a channel 34 having a plurality of sidewalls. At least one sidewall and typically both sidewalls will have a surface contour which corresponds to the edges of the masking pattern 33, as shown in FIG. 4. Typically, the elements 20 are equally spaced apart and are of about the same width, in the direction perpendicular to the end faces 14, to form periodically varying sidewalls. Generally, a chemical etchant such as HCl:H$_3$PO$_4$ is used.

Figure 5:
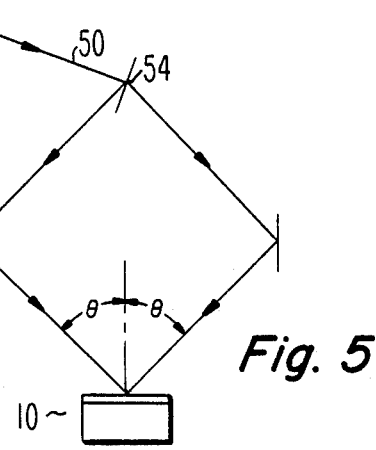
FIG. 5 is a schematic diagram of an exposure technique in the process of forming a grating pattern.

Preferably, the grating pattern 18 is formed by using holographic techniques. Typically, a laser emits a coherent light beam 50 which is split into two beams by a beam splitter 54. The light is then directed toward the surface of the structure 10, having a photoresist layer thereon. The interference of the two beams creates a periodic exposure of the photoresist as defined by $$\Lambda = \lambda/2 \sin \theta$$

where $\Lambda$ is the length of each period, $\lambda$ is the wavelength of the emitted laser beam and $\theta$ is the angle of incidence of the beams as shown in FIG. 5.

After the channel has been etched the structure 10 may be used as a substrate in forming a laser such as that disclosed by J. T. Andrews et al. in U.S. patent application (RCA 80,171) entitled "DISTRIBUTED FEEDBACK LASER", filed concurrently herewith.

Although the principles of the invention have been described in relation to the structure 10, it is to be understood that these principles are applicable to other structures incorporating alternative materials, layer structures and channel shapes such as rectangular or dove-tail shapes.

We claim:

1. A method of forming a variable width channel in a body having a pair of opposed end faces and a major surface extending therebetween, which comprises the steps of:

forming a plurality of masking elements having an opening therethrough on said major surface, said opening intersecting a plurality of said elements;

flowing said elements such that a plurality of said elements partially extend into said opening to form a masking pattern having a variable width opening;

removing a portion of said body exposed in said variable width opening to form a channel having a plurality of sidewalls with at least one sidewall having a surface contour corresponding to an edge of said masking pattern.

2. The method of claim 1, wherein said masking elements are substantially parallel and extend in the lateral direction.

3. The method of claim 2, wherein said opening is linear and is substantially perpendicular to the end faces.

4. The method of claim 1, wherein said masking elements are equally spaced apart and are of about the same width in the direction perpendicular to the end faces, to form at least one periodically varying sidewall.

5. The method of claim 4, wherein the masking elements flow together such that the spacing between the elements is eliminated.

6. The method of claim 1, wherein said masking elements are composed of photoresist and are formed by holographic techniques.

* * * * *